United States Patent
Lee et al.

(10) Patent No.: US 10,042,253 B2
(45) Date of Patent: Aug. 7, 2018

(54) PHOTOSENSITIVE RESIN COMPOSITION, FILM PREPARED BY USING THE PHOTOSENSITIVE RESIN COMPOSITION, AND ORGANIC LIGHT-EMITTING DISPLAY DEVICE INCLUDING THE FILM

(71) Applicant: Samsung Display Co., Ltd., Yongin-si, Gyeonggi-do (KR)

(72) Inventors: Dongki Lee, Yongin-si (KR); Kyungah Kim, Hwaseong-si (KR); Gilrae Kim, Hwaseong-si (KR); Dongjin Kim, Hwaseong-si (KR); SungChul Kim, Yongin-si (KR); Hyoengki Kim, Yongin-si (KR); Junghwan Park, Hwaseong-si (KR); Daebeom Shin, Yongin-si (KR); Yuiku Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/394,096

(22) Filed: Dec. 29, 2016

(65) Prior Publication Data

US 2017/0199454 A1    Jul. 13, 2017

(30) Foreign Application Priority Data

Jan. 11, 2016  (KR) .................. 10-2016-0003269
Nov. 3, 2016   (KR) .................. 10-2016-0145827

(51) Int. Cl.
G03F 7/032   (2006.01)
G03F 7/004   (2006.01)
G03F 7/033   (2006.01)
H01L 27/32   (2006.01)
G03F 7/16    (2006.01)
G03F 7/20    (2006.01)
G03F 7/32    (2006.01)
G03F 7/40    (2006.01)

(52) U.S. Cl.
CPC .......... *G03F 7/032* (2013.01); *G03F 7/0045* (2013.01); *G03F 7/033* (2013.01); *G03F 7/162* (2013.01); *G03F 7/168* (2013.01); *G03F 7/2002* (2013.01); *G03F 7/327* (2013.01); *G03F 7/40* (2013.01); *H01L 27/322* (2013.01)

(58) Field of Classification Search
CPC ....... G03F 7/038; G03F 7/0385; G03F 7/0388
See application file for complete search history.

(56) References Cited

U.S. PATENT DOCUMENTS

2009/0155583 A1* 6/2009 Xu .................. B82Y 10/00
                                                428/336
2015/0014819 A1* 1/2015 Hattori ............. G03F 7/0002
                                                257/618

FOREIGN PATENT DOCUMENTS

| JP | 2013-68749 | | 4/2013 |
| JP | 2013-96966 A | * | 5/2013 |
| KR | 10-2004-0092267 | | 11/2004 |
| KR | 10-2007-0036816 | | 4/2007 |
| KR | 10-2009-0094556 | | 9/2009 |
| KR | 10-2013-0056475 | | 5/2013 |
| KR | 10-1418026 B1 | | 8/2014 |
| WO | WO-2013/145829 A1 | * | 10/2013 |

OTHER PUBLICATIONS

English translation of JP 2013-96966 A obtained on May 18, 2017 from INPIT, Japanese patent Office, 11 pages.*

* cited by examiner

*Primary Examiner* — Cynthia Hamilton
(74) *Attorney, Agent, or Firm* — Lewis Roca Rothgerber Christie LLP

(57) ABSTRACT

A photosensitive resin composition includes a first binder resin represented by Formula 1. The photosensitive resin composition may be cured at a low temperature (e.g., about 0° C. to about 100° C., about 40° C. to about 100° C., or about 70° C. to about 100° C.). A film may be formed from the photosensitive resin composition. An organic light-emitting display (OLED) device may include the film prepared from the photosensitive resin composition.

Formula 1

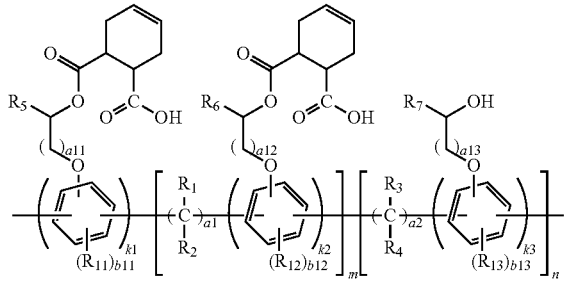

19 Claims, 8 Drawing Sheets

PHOTOSENSITIVE RESIN COMPOSITION, FILM PREPARED BY USING THE PHOTOSENSITIVE RESIN COMPOSITION, AND ORGANIC LIGHT-EMITTING DISPLAY DEVICE INCLUDING THE FILM

CROSS-REFERENCE TO RELATED APPLICATIONS

This application claims priority to and the benefit of Korean Patent Application Nos. 10-2016-0003269, filed on Jan. 11, 2016, and 10-2016-0145827, filed on Nov. 3, 2016, in the Korean Intellectual Property Office, the entire contents of each of which are incorporated herein by reference.

BACKGROUND

1. Field

One or more embodiments relate to a photosensitive resin composition, a film prepared by using the photosensitive resin composition, and an organic light-emitting display (OLED) device including the film.

2. Description of the Related Art

An OLED device generally includes a polarized film to prevent or reduce reflection of external light. The polarized film can prevent or reduce reflection of external light, but can also deteriorate the emission efficiency of the OLED device and increase a manufacturing cost.

As a result, an anti-reflective color filter has been used instead of a polarized film. However, unlike a color filter used in a liquid crystal display (LCD) device that may be prepared at a high temperature, for example, a temperature of 200° C. or higher, a color filter used in an OLED device is manufactured through a low-temperature process.

SUMMARY

One or more embodiments include a photosensitive resin composition that is capable of being cured at a low temperature.

One or more embodiments include a film having an excellent anti-reflection effect prepared by curing the photosensitive resin composition.

One or more embodiments include an organic light-emitting display (OLED) device including the film.

Additional aspects will be set forth in part in the description which follows and, in part, will be apparent from the description, or may be learned by practice of the presented embodiments.

According to one or more embodiments, a photosensitive resin composition includes a first binder resin represented by Formula 1:

In Formula 1, $R_1$ to $R_4$ and $R_{11}$ to $R_{13}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_5$ to $R_7$ are each independently a group including an unsaturated ethylene-based group, the group including the unsaturated ethylene-based group does not include a phthalate group, a1 and a11 to a13 are each independently an integer of 1 to 5, a2 may be an integer of 0 to 5, b11 to b13 may each independently be an integer of 0 to 3, k1, k2, k3, m, and n are each independently a molar ratio in a corresponding repeating unit, the sum of k1 and k2 is an integer of 1 to 20, k3 is an integer of 1 to 10, m and n are each independently an integer 1 to 10, and at least one substituent selected from substituents of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group is selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

According to one or more embodiments, a film is formed by curing the photosensitive resin composition.

According to one or more embodiments, an organic light-emitting display device (OLED) includes the film.

Formula 1

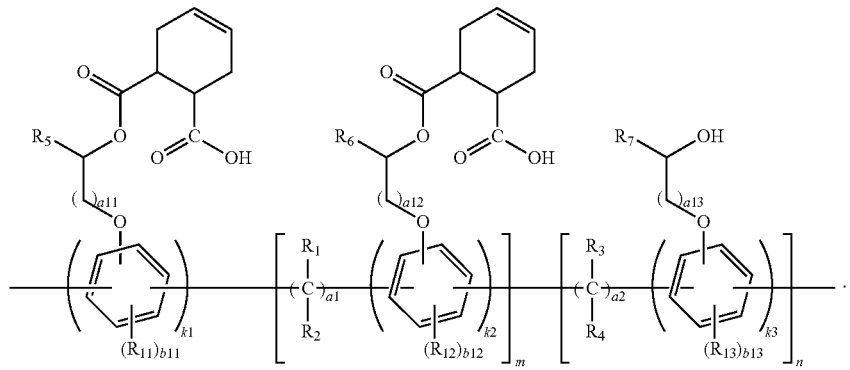

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
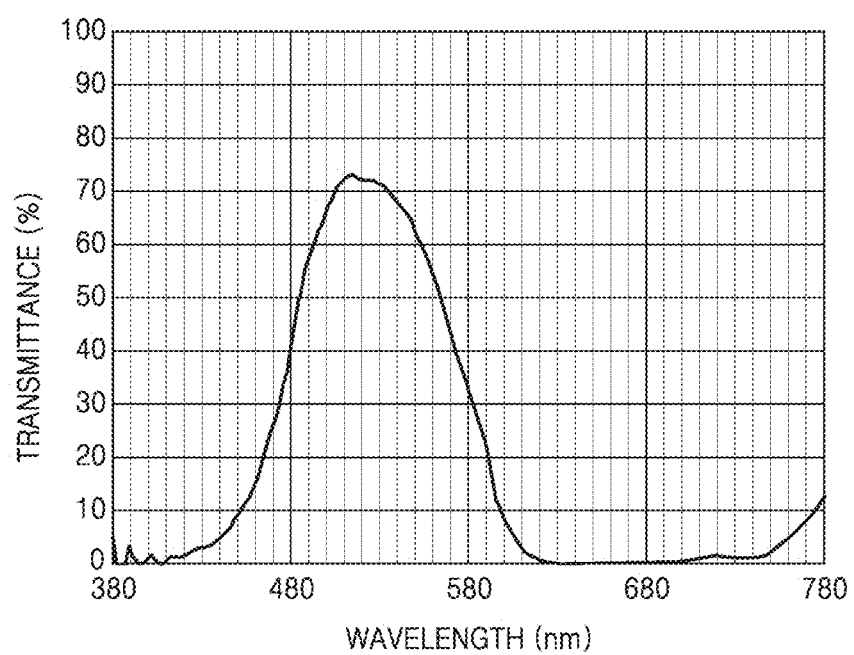
FIG. 1 is a graph showing spectroscopic characteristics of a photosensitive resin composition prepared according to Example 1.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. Expressions such as "at least one of," when preceding a list of elements, modify the entire list of elements and do not modify the individual elements of the list.

It will be further understood that the terms "comprises" and/or "comprising" used herein specify the presence of stated features or components, but do not preclude the presence or addition of one or more other features or components.

As used herein, the term "photosensitive resin composition" refers to a low-temperature-curing-type photosensitive resin composition, and the term "low-temperature-curing-type photosensitive resin composition" refers to a photosensitive resin composition that may be fully cured (e.g., substantially fully cured) at a low temperature, for example, at 100° C. or lower (e.g., about 0° C. to about 100° C., about 40° C. to about 100° C., or about 70° C. to about 100° C.).

As described herein, at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group may be selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

As used herein, * and *' each independently indicate a binding site to a neighboring atom.

Hereinafter, components of the photosensitive resin composition will be described in more detail.

First Binder Resin

In one embodiment, the photosensitive resin composition may include a first binder resin which may be an alkali-soluble binder resin. The photosensitive resin composition may include the first binder resin having a set or particular structure so that the photosensitive resin composition has an improved photocuring degree and an improved thermal curing degree (e.g., the photosensitive resin may achieve a more complete cure by way of photocuring and/or thermal curing).

As used herein, the term "alkali-soluble" denotes that a subject may be dissolved in an alkali aqueous solution.

The first binder resin may be thermally cross-linkable, and may include an unsaturated ethylene-based group, and thus, the first binder resin may react to UV light.

The first binder resin may be represented by Formula 1:

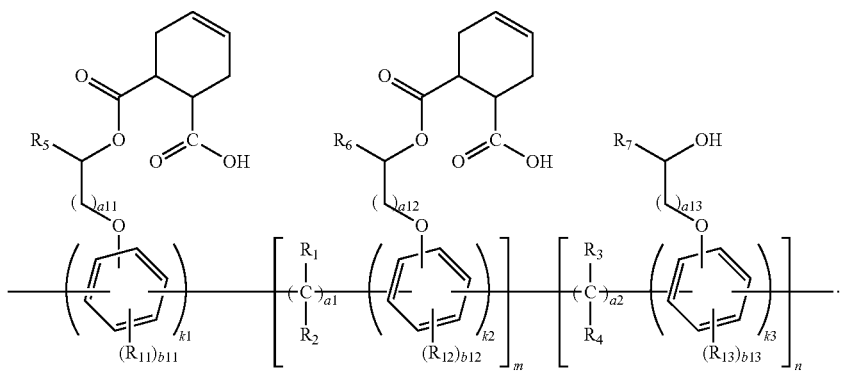

Formula 1

In Formula 1, $R_1$ to $R_4$ and $R_{11}$ to $R_{13}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group.

In various embodiments, in Formula 1, $R_1$ to $R_4$ and $R_{11}$ to $R_{13}$ may each independently be hydrogen, deuterium, or a substituted or unsubstituted $C_1$-$C_{20}$ alkyl group, but embodiments of Formula 1 are not limited thereto.

In various embodiments, in Formula 1, $R_5$ to $R_7$ may each independently be a group including an unsaturated ethylene-based group, and the group including the unsaturated ethylene-based group may not include a phthalate group.

In various embodiments, in Formula 1, the unsaturated ethylene-based group of the group including the unsaturated ethylene-based group may be an acryloyl group, an acrylate group, a vinyl group, a styryl group, an aryl group, or any combination thereof. As used herein, the terms "combination thereof" and "combinations thereof" may refer to a chemical combination (e.g., an alloy or chemical compound), a mixture, or a laminated structure of components.

In various embodiments, in Formula 1, $R_5$ to $R_7$ may each independently be a group including an acrylate group, but embodiments of Formula 1 are not limited thereto.

In various embodiments, in Formula 1, $R_5$ to $R_7$ may each independently be a group represented by *—$R_a$OC(=O)CH=$CH_2$, and $R_a$ may be a substituted or unsubstituted $C_1$-$C_{20}$ alkylene group.

In various embodiments, in Formula 1, at least one substituent of the substituted $C_1$-$C_{20}$ alkylene group may be selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group, and * indicates a binding site to a neighboring atom.

In some embodiments, the group including the unsaturated ethylene-based group may have time-dependent stability by not including a phthalate group.

In Formula 1, a1 and a11 to a13 may each independently be an integer of 1 to 5, a2 may be an integer of 0 to 5, and b11 to b13 may each independently be an integer of 0 to 3.

In Formula 1, a1 denotes the number of *—$C(R_1)(R_2)$—*', and when a1 is 2 or greater, two or more *—$C(R_1)(R_2)$—*'s may be identical to or different from each other.

In Formula 1, a11 to a13 each independently denote the number of *—$CH_2$—*'.

In Formula 1, a2 denotes the number of *—$C(R_3)(R_4)$—*', and when a2 is 2 or greater, two or more *—$C(R_3)(R_4)$—*'s may be identical to or different from each other.

In Formula 1, b11 denotes the number of $R_{11}$, and when b11 is 2 or greater, two or more $R_{11}$s may be identical to or different from each other.

In Formula 1, b12 denotes the number of $R_{12}$, and when b12 is 2 or greater, two or more $R_{12}$s may be identical to or different from each other.

In Formula 1, b13 denotes the number of $R_{13}$, and when b13 is 2 or greater, two or more $R_{13}$s may be identical to or different from each other.

In Formula 1, k1, k2, k3, m, and n may each independently be a molar ratio of a corresponding repeating unit.

In Formula 1, the sum of k1 and k2 may be an integer of 1 to 20. For example, the sum of k1 and k2 may be an integer of 1 to 10.

In Formula 1, k3 may be an integer of 1 to 10. For example, k3 may be an integer of 1 to 5.

In Formula 1, m and n may each independently be an integer of 1 to 10. For example, m and n may each independently be an integer of 1 to 5.

In Formula 1, the molar ratio of m:n may be in a range of about 10:90 to about 50:50. For example, the molar ratio of m:n may be in a range of about 20:80 to about 40:60.

In Formula 1, when the molar ratio of m:n is within the foregoing ranges, the photosensitive resin including the first binder resin may have excellent pattern straightness after a developing process.

In various embodiments, the first binder resin may be represented by Formula 1A:

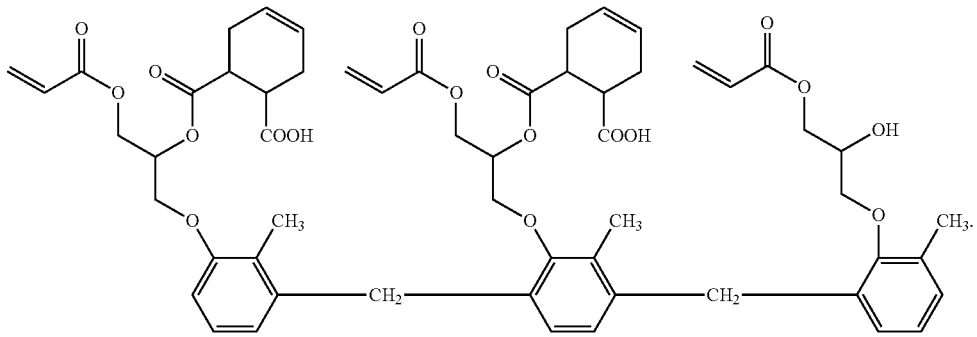

Formula 1A

The first binder resin represented by Formula 1 may be prepared by partially introducing i) phthalic anhydrate for alkali-solubility and ii) an unsaturated ethylene-based group for increasing a photocuring degree, to a bisphenol epoxy resin.

The first binder resin represented by Formula 1 may be capable of being cured at a low temperature (e.g., at about 0° C. to about 100° C., about 40° C. to about 100° C., or about 70° C. to about 100° C.) by including the bisphenol epoxy resin and the group including the unsaturated ethylene-based group.

In addition, the first binder resin represented by Formula 1 may have excellent adhesion strength (e.g., adhesion strength to a substrate being coated by the first binder resin) by including a repeating unit having a hydroxide group (—OH).

In various embodiments, a weight average molecular weight of the first binder resin represented by Formula 1, measured by gel permeation chromatography, may be in a range of about 1,000 g/mol to about 50,000 g/mol. For example, a weight average molecular weight of the first binder resin represented by Formula 1 may be in a range of about 1,000 g/mol to about 25,000 g/mol. For example, a weight average molecular weight of the first binder resin represented by Formula 1 may be in a range of about 1,000 g/mol to about 12,000 g/mol.

When a weight average molecular weight of the first binder resin represented by Formula 1 is within the foregoing ranges, the photosensitive resin composition may easily form a pattern on a flexible substrate and may have excellent developing ability with respect to an alkali development solution.

In various embodiments, when a weight average molecular weight of the first binder resin represented by Formula 1 is less than about 1,000 g/mol, pattern breakup may occur during development of an image. Also, when a weight average molecular weight of the first binder resin represented by Formula 1 is higher than about 50,000 g/mol, a developing rate is excessively slow such that a remaining film may be found.

In one embodiment, an acid value of the first binder resin represented by Formula 1 may be in a range of about 50 mgKOH/g to about 120 mgKOH/g, or for example, about 70 mgKOH/g to about 100 mgKOH/g.

When an acid value of the first binder resin represented by Formula 1 is within the foregoing ranges, a developing ability with respect to an alkali development solution during pattern formation is excellent, which may result in improving the proportion of film remaining and straightness of the alkali-soluble binder resin, and thus pattern breakup may not occur (or may substantially not occur).

When an acid value of the first binder resin represented by Formula 1 is less than about 50 mgKOH/g, developing characteristics may deteriorate, and thus remaining film may be found. Also, when an acid value of the first binder resin represented by Formula 1 is higher than about 120 mgKOH/g, a developing rate is excessively fast such that straightness of a pattern may deteriorate, and/or pattern breakup may occur.

In various embodiments, an amount of the first binder resin represented by Formula 1 may be in a range of about 3 wt % to about 10 wt % based on the total weight of the photosensitive resin composition.

For example, an amount of the first binder resin represented by Formula 1 may be in a range of about 3 wt % to about 10 wt % based on the total weight of the photosensitive resin composition.

When an amount of the first binder resin represented by Formula 1 is within the foregoing ranges, a pattern formed by using the photosensitive resin composition may have excellent adhesion and excellent straightness, and thus the first binder resin may be used in the formation of a microcircuit board.

When an amount of the first binder resin is less than about 3 wt %, adhesion of a pattern is weakened and a photocuring degree may deteriorate. Also, when an amount of the first binder resin is higher than about 30 wt %, pattern straightness may deteriorate due to an increase in a developing time.

Second Binder Resin

The photosensitive resin composition may include a second binder resin. For example, the photosensitive resin composition may further include, in addition to the first binder resin, the second binder resin.

The photosensitive resin composition may further include the second binder resin having a set or particular structure so that the photosensitive resin composition has excellent transparency and an improved low-temperature curing property.

For example, the second binder resin may include an epoxy resin.

For example, the second binder resin may include a siloxane-containing epoxy resin.

In some embodiments, the second binder resin may be a mixture of a siloxane-containing epoxy resin and a siloxane-free epoxy resin.

The second binder resin may be a thermally cross-linkable binder resin that may react to heat.

For example, the second binder resin may be represented by Formula 2:

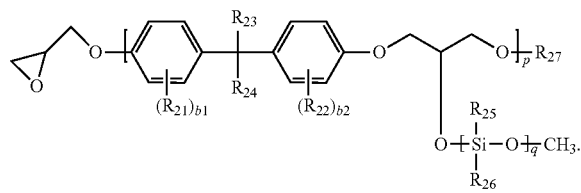

Formula 2

In Formula 2, $R_{21}$ to $R_{24}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{25}$ and $R_{26}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, and $R_{27}$ may be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted $C_1$-$C_{30}$ heteroaryl group, and a group represented by Formula 3.

In Formula 2, b1 and b2 may each independently be an integer of 0 to 4.

In Formula 2, b1 denotes the number of $R_{21}$, and when b1 is 2 or greater, two or more $R_{21}$s may be identical to or different from each other.

In Formula 2, b2 denotes the number of $R_{22}$, and when b2 is 2 or greater, two or more $R_{22}$s may be identical to or different from each other.

In Formula 2, p and q may each independently be a molar ratio of a corresponding repeating unit, p may be an integer of 5 to 300, and q may be an integer of 0 to 20 (or 1 to 20).

For example, p and q may each independently be a molar ratio of a corresponding repeating unit, p may be an integer of 5 to 300, and q may be an integer of 5 to 20.

For example, in Formula 2, p may be an integer of 10 to 15, and q may be an integer of 3 to 10.

In Formula 2, when p is less than 5, a reaction with another layer may easily occur during pattern stacking, and when p is greater than 300, a developing property may deteriorate. Also, when q is greater than 20, a pattern developing property may deteriorate.

In Formula 2, q denotes a molar ratio of a siloxane-containing repeating unit, and when q is 1 or greater, a curing property of the photosensitive resin composition may improve.

In Formula 2, $R_{27}$ may be a group represented by Formula 3:

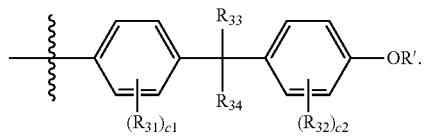

<Formula 3>

In Formula 3, $R_{31}$ and $R_{32}$ may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, and $R_{33}$, $R_{34}$, and R' may each independently be selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group.

In Formula 3, c1 and c2 may each independently be an integer of 0 to 4.

In Formula 3, c1 denotes the number of $R_{31}$, and when c1 is 2 or greater, two or more $R_{31}$s may be identical to or different from each other.

In Formula 3, c2 denotes the number of $R_{32}$, and when c2 is 2 or greater, two or more $R_{32}$s may be identical to or different from each other.

In one embodiment, in Formula 3, R' may include at least one epoxy group.

In various embodiments, in Formula 2, $R_{23}$ to $R_{26}$ may each independently be a substituted or unsubstituted $C_1$-$C_{20}$ alkyl group, and $R_{27}$ may be a group represented by Formula 3, and in Formula 3, R' may be a $C_1$-$C_{20}$ alkyl group substituted with an epoxy group or a $C_6$-$C_{30}$ aryl group substituted with an epoxy group, p may be an integer of 10 to 300, and q may be an integer of 3 to 20, but embodiments are not limited thereto.

In various embodiments, the second binder resin may be represented by Formula 2-1:

Formula 2-1

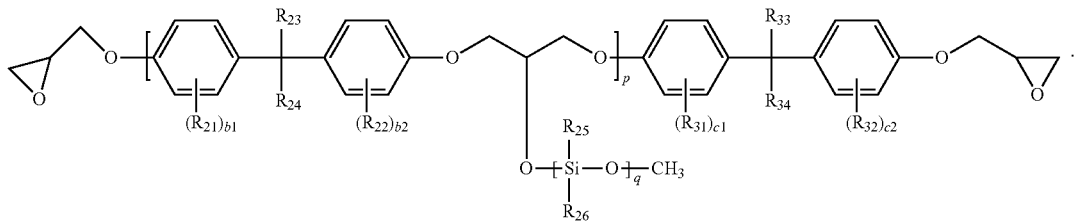

In Formula 2-1, $R_{21}$ to $R_{26}$, b1, b2, p, q, $R_{31}$ to $R_{34}$, c1 and c2 are each independently the same as defined herein.

In Formula 2-1, q may be an integer of 1 to 20.

In Formula 2-1, $R_{25}$ may be a methyl group and $R_{26}$ may be a methoxy group.

In Formula 2-1, $R_{23}$, $R_{24}$, $R_{33}$, and $R_{34}$ may each be a $C_1$-$C_{10}$ alkyl group, $R_{25}$ may be a methyl group, $R_{26}$ may be a methoxy group, p may be an integer of 10 to 15, and q may be an integer of 3 to 10.

For example, the second binder resin may be at least one selected from a siloxane-containing epoxy resin represented by Formula 2A and a siloxane-free epoxy resin represented by Formula 2B:

Formula 2A

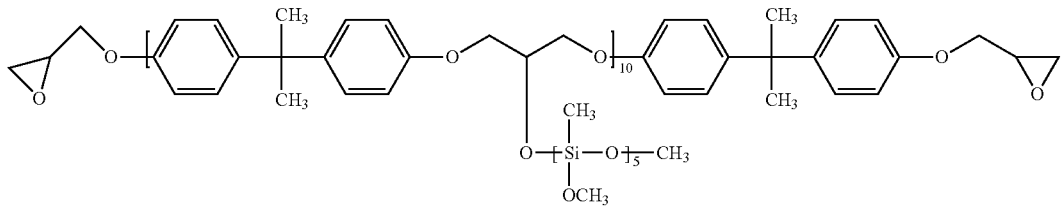

Formula 2B

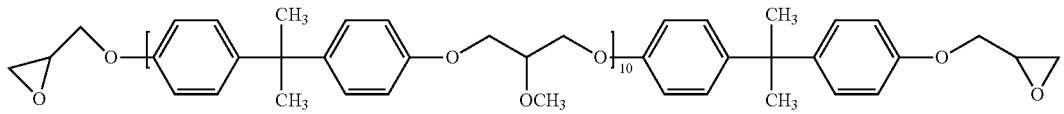

The second binder resin may further include a general epoxy resin. For example, the epoxy resin may be selected from a bisphenol A-type epoxy resin, a bisphenol F-type epoxy resin, a phenol novolac-type epoxy resin, and a cresol novolac-type epoxy resin.

Examples of the bisphenol A-type epoxy resin may be commercially available as Epikote 1001, 1002, 1003, 1004, 1007, 1009, 1010, and 828 (Yuka Shell Epoxy Co. Ltd.). Examples of the bisphenol F-type epoxy resin may be commercially available as Epikote 807 and 834 (Yuka Shell Epoxy Co. Ltd.). Examples of the phenol novolac-type epoxy resin may be commercially available as Epikote 152, 154, and 157H65 (Yuka Shell Epoxy Co. Ltd.), and EPPN-201, EPPN-501N, EPPN-501H, EPPN-502N, EPPN-501HY, and EOCN-1020 (Nippon Kayaku Co. Ltd.). Examples of the cresol novolac-type epoxy resin may be commercially available as EOCN-1025, EOCN-1035, EOCN-1405, EOCN-1020, EOCN-1025, EOCN-1027 (Nippon Kayaku Co. Ltd.), and Epikote 180S75 (Yuka Shell Epoxy Co. Ltd.).

Examples of other available epoxy resins may be NC-3000, NC-3000H (Nippon Kayaku Co. Ltd.), CY175, CY177, CY179 (BASF SE), and a mixture thereof.

An amount of the second binder resin may be in a range of about 1 wt % to about 10 wt % based on the total weight of the photosensitive resin composition.

When the amount of the second binder resin is within the foregoing range, a developing property with respect to an alkali developing solution improves, and adhesive strength with respect to a substrate may increase due to an excellent low-temperature curing property of the second binder resin.

Photo Cross-Linking Agent

The photosensitive resin composition may include a photo cross-linking agent.

The photo cross-linking agent may include at least one monomer selected from a cross-linking monomer having an unsaturated ethylene-based group and a urethane monomer.

The cross-linking monomer having an unsaturated ethylene-based group may be selected from 1,4-butanedioldiacrylate, 1,3-butyleneglycoldiacrylate, ethyleneglycoldiacrylate, pentaerythritoltetraacrylate, triethyleneglycoldiacrylate, polyethyleneglycoldiacrylate, dipentaerythritoldiacrylate, sorbitoltriacrylate, a bisphenol-A diacrylate derivative, trim ethylpropanetriacrylate, dipentaerythritolpolyacrylate, dipentaerythritolhexaacrylate, and methacrylates thereof. Also, the cross-linking monomer having an unsaturated ethylene-based group may include a dendrimer including randomly bonded double bonds.

The urethane monomer may be a general cross-linking monomer having a urethane structure, and a type (or kind) of the urethane monomer is not limited thereto.

In one embodiment, an amount of the photo cross-linking agent may be in a range of about 3 wt % to about 15 wt % based on the total weight of the photosensitive resin composition.

In various embodiments, an amount of the photo cross-linking agent may be in a range of about 3 wt % to about 10 wt % based on the total weight of the photosensitive resin composition.

When an amount of the photo cross-linking agent is within the foregoing range, the photosensitive resin composition may have an excellent photocuring degree, an excellent developing property with respect to an alkali developing solution, and straightness during pattern formation.

When an amount of the photo cross-linking agent is less than about 3 wt %, a curing degree may decrease and chemical resistance may also decrease. Also, when an amount of the photo cross-linking agent is greater than about 15 wt %, adhesion strength of film may decrease as the film hardens.

In various embodiments, the photo cross-linking agent may further include, in addition to a cross-linking monomer having an unsaturated ethylene-based group and/or a urethane monomer, a thiol-based monomer.

When the photo cross-linking agent includes a thiol-based monomer, an amount of the thiol-based monomer may be in a range of about 0.01 wt % to about 1 wt % based on the total weight of the photosensitive resin composition, but embodiments are not limited thereto.

The thiol-based monomer may be a trivalent or more polythiol, or, for example, may be selected from tris[2-(3-mercaptopropionyloxy)ethyl]isocyanurate (TEMPIC) and [pentaerythritol tetrakis(3-mercaptopriopionate)].

When the photo cross-linking agent further includes the thiol-based monomer, the photo cross-linking agent may increase a cross-linking property. In addition, the thiol-based monomer may be quickly cured at a low temperature (e.g., about 0° C. to about 100° C., about 40° C. to about 100° C., or about 70° C. to about 100° C.), and accordingly, strong adhesion strength is imparted to the photo cross-linking agent and chemical resistance improves against a solvent.

In one embodiment, the photosensitive resin composition may include the first binder resin and the photo cross-linking agent. Here, a weight ratio of the photo cross-linking agent and the first binder resin may be in a range of about 1:0.6 to about 1:2.5.

For example, a weight ratio of the photo cross-linking agent and the first binder resin may be in a range of about 1:0.6 to about 1:2.0.

When a weight ratio of the photo cross-linking agent and the first binder resin is within the foregoing ranges, adhesion strength between a pattern and a substrate during a developing process using an alkali development solution improves, and color change during pattern stacking may be prevented or reduced.

When a mixing ratio of the alkali-soluble binder resin is less than 0.6-fold, pattern breakup may occur during a developing process. Also, when a mixing ratio of the alkali-soluble binder resin is greater than 2.5-fold, a cross-linking property decreases, which may cause color change during pattern stacking.

Thermal Curing Agent

The photosensitive resin composition may include a thermal curing agent. The thermal curing agent is stable at room temperature and, for example, may react at a temperature in a range of about 80° C. to about 100° C., but a type of the thermal curing agent is not limited thereto.

The thermal curing agent may include at least one selected from an aromatic amine compound, an alicyclic amine-based compound, an aromatic amine-based compound, a carboxylic acid-based compound, an acid anhydride-based compound, a polyphenol-based compound, and an imidazole-based compound.

Examples of the aromatic amine-based compound as a commercially available thermal curing agent may include, for example, Isophorone Diamine (available from BASF, as Baxxodur® EC 201), PN-23, MY-24, PN-40J, PN-31, AH-300, or MY-24 (available from AJINOMOTO FINE TECHNO. Ltd.).

An amount of the thermal curing agent may be in a range of about 0.1 wt % to about 5 wt % based on the total weight of the photosensitive resin composition, and when an amount of the thermal curing agent is within the foregoing range, a low-temperature curing degree may increase and storing stability may improve.

When an amount of the thermal curing agent is less than about 0.1 wt %, a thermal curing property decreases, which may cause mixing of colors during pattern stacking. Also, when an amount of the thermal curing agent is greater than about 5 wt %, time-dependent stability may decrease.

Photoinitiator

The photosensitive resin composition may include a photoinitiator. The photoinitiator used herein initiates polymerization of cross-linking monomers in response to wavelengths of visible rays, UV rays, and/or far-UV rays.

The photoinitiator may include at least one selected from an oxime-based compound, a triazine-based compound, a benzoin-based compound, an acetophenone-based compound, a xanthone-based compound, and an imidazole-based compound, but the photoinitiator is not limited thereto.

Examples of the photoinitiator may include, for example, an oxime-based compound such as OXE-01 or OXE-02 available from BASF SE; a triazine-based compound such as 2,4-bistrichloromethyl-6-p-methoxystyryl-s-triazine, 2-p-methoxystyryl-4,6-bistrichloromethyl-s-triazine, 2,4-trichloromethyl-6-triazine, or 2,4-trichloromethyl-4-methyl-naphthyl-6-triazine; a benzoin-based compound such as benzophenone or p-(diethylamino)benzophenone; an acetophenone-based compound such as 2,2-dichloro-4-phenoxy-acetophenone, 2,2-diethoxyacetophenone, 2,2-dibutoxyacetophenone, 2-hydroxy-2-methylpropiophenone, or p-t-butyltrichloroacetophenone; a xanthone-based compound such as xanthone, thioxanthone, 2-methylthio xanthone, 2-isobutylthioxanthone, 2-dodecylthioxanthone, 2,4-dimethylthioxanthone, or 2,4-diethylthioxanthone; and an imidazole-based compound such as 2,2-bis-2-chlorophenyl-4,5,4,5-tetraphenyl-2-1,2-bisimidazole or 2,2-bis(2,4,6-tricyanophenyl)-4,4,5,5-tetraphenyl-1,2-bisimidazole.

An amount of the photoinitiator may be in a range of about 0.3 wt % to about 5 wt % based on the total weight of the photosensitive resin composition. For example, the amount of the photoinitiator may be in a range of about 0.5 wt % to about 2 wt % based on the total weight of the photosensitive resin composition.

When an amount of the photoinitiator is within the foregoing ranges, a photosensitive resin composition provided by using the photoinitiator may have an excellent curing property, storage stability, and pattern straightness, and a pattern may be easily formed by using the photosensitive resin composition.

When an amount of the photoinitiator is less than 0.3 wt %, a curing degree of the composition deteriorates, a pattern may not be easily formed, and pattern straightness may degrade. Also, when an amount of the photoinitiator is greater than 5 wt %, a pattern formed by using the composition may have low storage stability and resolution, and residue may remain on a part other than the pattern.

Pigment

The photosensitive resin composition may include a pigment.

Any suitable organic pigment and/or any suitable inorganic pigment available in the art may be used as the pigment. Examples of the organic pigment may include C.I. #177, #202, #209, #242, #254, and #255, as a red pigment; C.I. #150, #138, and #128, as a yellow pigment; C.I. #43, as an orange pigment; C.I. #7, #36, and #58, as a green pigment; C.I. #15, #15:3, and #15:6, as a green pigment; C.I. #23, as a violet pigment; and C.I. #1 and #7, as a black pigment. Also, examples of the inorganic pigment include titanium oxide, titanium black, and carbon black. One pigment may be used alone or two types or more of the pigments may be mixed for color combination.

An amount of the pigment may be in a range of 3 wt % to 15 wt % based on the total weight of the photosensitive resin compound.

The pigment may be directly added to the composition or may be added in the form of a pigment dispersion including a dispersing agent or a solvent.

Here, the dispersing agent in the pigment dispersion may be selected from a non-ionic dispersing agent, an ionic dispersing agent, and a cationic dispersing agent, and examples of the dispersing agent may include polyalkyleneglycol and an ester thereof; polyoxyalkylene; a polyhydric alcohol ester alkylene oxide adduct; an alcohol alkylene oxide adduct; and alkylamine, which may be used alone or as an appropriate combination thereof. Also, an amount of the dispersing agent in the pigment dispersion may be in a range of about 1 part to about 5 parts by weight based on 100 parts by weight of the pigment.

Also, examples of the solvent included in the pigment dispersion composition may include ethyleneglycolacetate, ethylcellosolve, propyleneglycol methylether acetate, ethyl lactate, polyethyleneglycol, cyclohexanone, and propyleneglycolmethyl ether. Here, an amount of the solvent may be controlled so that the pigment or a solid content of the pigment dispersion is in a range of about 5 wt % to about 30 wt %.

A particle diameter of the pigment may be determined in consideration of dispersion stability and pixel resolution, and, for example, a number average particle diameter of the pigment may be in a range of about 30 nm to about 200 nm.

The amount of the pigment may be in a range of 3 wt % to 15 wt % based on the total weight of the photosensitive resin composition. The amount of the pigment may vary in consideration of a color reproduction range, a pattern forming property, and curing characteristics according to use of the pigment.

Solvent

The photosensitive resin composition may include a solvent for solubility or a coating property.

Examples of the solvent may include at least one selected from propyleneglycol monoethylether acetate, ethoxypropionic acid ethyl, butylacetic acid, ethyleneglycol monomethylether acetate, propyleneglycol monomethyl ether, propyleneglycol methylether acetate, diethyleneglycol dimethylether, diethyleneglycolmethylethyl ether, cyclohexanone, 3-methoxypropionic acid ethyl, and 3-ethoxypropionic acid methyl.

In various embodiments, the solvent may be at least one selected from propyleneglycol monoethylether acetate, ethoxypropionic acid ethyl, and butylacetic acid.

An amount of the solvent varies according to a viscosity or a total amount of solid in the composition, and thus the amount of the solvent may be included as an amount remaining other than the solid in the photosensitive composition according to an embodiment of the present disclosure.

Dye and Additive

The photosensitive resin composition may include a dye.

The photosensitive resin composition may include an additive.

In one embodiment, the photosensitive resin composition may further include at least one selected from a dye at an amount in a range of about 0.01 wt % to about 15 wt % and/or an additive at an amount in a range of about 0.01 wt % to about 1 wt % based on the total weight of the photosensitive resin composition.

The photosensitive resin composition according to an embodiment of the present disclosure may further include a dye in addition to the pigment described above. The dye has unique spectral characteristics within a set or particular wavelength range, which influences a light-transmitting degree and a light-transmitting width of a color filter formed by the composition by a synergetic reaction with the pigment showing a set or particular color to improve color purity, and improves luminance and contrast. The dye may be at least one selected from a fluorine-based compound, an azo-based compound, an anthraquinone-based compound, an indigo-based compound, a xanthine-based compound, a triphenylmethane-based compound, a phthalocyanine-based compound, an imine-based compound, and a quinophthalone-based compound.

In addition, an amount of the dye may be in a range of 0.01 wt % to 15 wt %, or, for example, 0.01 wt % to 5 wt % or 0.1 wt % to 3 wt %, based on the total weight of the photosensitive resin composition, wherein increasing effects of spectral characteristics are produced according to the addition of the dye.

The dye may be directly added to the composition according to an embodiment of the disclosure by itself or in the form of a dye dispersion including a dispersing agent or a solvent.

A dispersing agent that may be included in the dye dispersion may be the same or substantially the same as the dispersing agent that may be included in the pigment dispersion.

The dispersing agent may be included at an amount in a range of about 1 part to about 5 parts by weight based on 100 parts by weight of the dye.

In addition, a solvent that may be included in the dye dispersion may be the same or substantially the same as the solvent that may be included in the pigment dispersion.

An amount of the solvent may be controlled so that a solid content of the dye dispersion is in a range of 5 wt % to 30 wt %.

In addition, a particle diameter of the dye may be determined in consideration of dispersion stability and pixel resolution, and, for example, an average particle diameter of the dye may be in a range of 30 nm to 200 nm.

In addition, the photosensitive resin composition according to an embodiment of the present disclosure may include a dispersing agent for improving dispersibility with respect to the pigment or an additive for improving a coating property. For example, the dispersing agent and/or the additive may include a polyester-based dispersing agent, a polyurethane-based dispersing agent, and/or a polyacryl-based dispersing agent and/or a surfactant such as a silicon-based surfactant and/or a fluorine-based surfactant.

In various embodiments, to improve curing efficiency and a curing rate, the additive may be a catalyst such as a thermal latent curing agent and/or a photocuring initiator. Examples of the additive include dicyandiamide, dihydride, imidazole, urea, sulfonium salt, phosphonium salt, octylic acid, and a metal compound such as platinum or tin.

An amount of the additive may be in a range of about 0.01 wt % to about 1 wt %, or, for example, about 0.1 wt % to about 1 wt %, based on the total weight of the photosensitive resin composition.

Any combination or amounts of the constituents of the photosensitive resin composition may be used.

For example, the photosensitive resin composition may include the first binder resin, the second binder resin, and the thermal curing agent.

For example, the photosensitive resin composition may include the first binder resin, the photo cross-linking agent, the thermal curing agent, the photoinitiator, the pigment, and the solvent.

For example, the photosensitive resin composition may include the first binder resin, the second binder resin, the photo cross-linking agent, the thermal curing agent, the photoinitiator, the pigment, and the solvent.

For example, the photosensitive resin composition may include the first binder resin, the photo cross-linking agent, the thermal curing agent, the photoinitiator, the pigment, and the solvent, and, for example, may include, based on 100 wt % of the photosensitive resin composition, the first binder resin at an amount in a range of about 3 wt % to about 30 wt % and the photo cross-linking agent at an amount in a range of about 3 wt % to about 15 wt %.

For example, the photosensitive resin composition may include the first binder resin, the second binder resin, the photo cross-linking agent, the thermal curing agent, the photoinitiator, the pigment, and the solvent, and, for example, may include, based on 100 wt % of the photosensitive resin composition, the first binder resin at an amount in a range of about 3 wt % to about 30 wt %, the second binder resin at an amount in a range of about 1 wt % to about 10 wt %, and the photo cross-linking agent at an amount in a range of about 3 wt % to about 15 wt %.

For example, the photosensitive resin composition may include, based on 100 wt % of the photosensitive resin composition, the first binder resin at an amount in a range of about 3 wt % to about 30 wt %, the photo cross-linking agent at an amount in a range of about 3 wt % to about 15 wt %, the thermal curing agent at an amount in a range of about 0.1 wt % to about 5 wt %, the photoinitiator at an amount in a range of about 0.3 wt % to about 5 wt %, the pigment at an amount in a range of about 3 wt % to about 15 wt %, the dye at an amount in a range of about 0.01 wt % to about 15 wt %, the additive amount of about 0.01 wt % to about 1 wt %, and the residue solvent.

For example, the photosensitive resin composition may include, based on 100 wt % of the photosensitive resin composition, the first binder resin at an amount in a range of about 2 wt % to about 20 wt %, the second binder resin at an amount in a range of about 1 wt % to about 10 wt %, the photo cross-linking agent at an amount in a range of about 3 wt % to about 15 wt %, the thermal curing agent at an amount in a range of about 0.1 wt % to about 5 wt %, the photoinitiator at an amount in a range of about 0.3 wt % to about 5 wt %, the pigment at an amount in a range of about 3 wt % to about 15 wt %, the dye at an amount in a range of about 0.01 wt % to about 15 wt %, the additive at an amount in a range of about 0.01 wt % to about 1 wt %, and the residue solvent.

The photosensitive resin composition may include any suitable combination of the components selected from the first binder resin, the second binder resin, the photo cross-linking agent, the thermal curing agent, the photoinitiator, the pigment, the dye, the additive, and the solvent so that the total weight of the components may be 100 wt %. In addition, the photosensitive resin composition may include any other suitable components at an amount within a range that does not adversely affect performance of the photosensitive resin composition. Unless unwanted reactions or precipitants occur, the components may be mixed in any suitable order. For example, any two components may be mixed first, and then, the remaining components may be mixed together. For example, the components may be mixed together at the same or substantially the same time.

Film Formed by Curing Photosensitive Resin Composition and Organic Light-Emitting Display (OLED) Device Including the Film A film may be prepared by curing the photosensitive resin composition described above.

The film may serve as a color filter that is used as an anti-reflection film, and may be used in preparation of an OLED device to increase anti-reflection of external light and OLED efficiency.

The film may be prepared by using any suitable method in the art, except that the photosensitive resin composition according to an embodiment of the present disclosure is used.

For example, in one embodiment of the method of forming a desirable pattern on the film, the film may be coated on a substrate at a thickness in a range of about 1 µm to about 5 µm by using spin coating or slit coating with the photosensitive resin composition, irradiated with light to form a set or predetermined pattern, treated with a developing solution, and baked at a temperature in a range of about 80° C. to about 100° C. for 30 seconds to 5 minutes.

In various embodiments, the film may be prepared by curing the photosensitive resin composition at a low temperature (e.g., about 0° C. to about 100° C., about 40° C. to about 100° C., or about 70° C. to about 100° C.). For example, the photosensitive resin composition may be cured at a temperature in a range of about 0° C. to about 100° C., or for example, at a temperature in a range of about 40° C. to about 100° C. or a temperature in a range of about 70° C. to about 100° C.

The OLED device may include a substrate, a first electrode, a second electrode facing the first electrode, an organic layer disposed between the first electrode and the second electrode and including an emission layer, and the film prepared by curing the photosensitive resin composition.

The OLED device shows high transmittance of about 60% or greater. Such high transmittance may result from high color reproduction rates associated with full width half maximum (FWHM), wherein FWHM is narrower in an OLED device using the film prepared by curing the photosensitive resin composition than in an OLED device using a polarized film instead of the film.

The OLED device may further include a polarized film.

In one embodiment, the film prepared by curing the photosensitive resin composition may include not only a single-layered film, but also a multi-layered film such as, for example, a double-layered film or a triple-layered film.

In various embodiments, the OLED device may have a stacked structure including a first film prepared by curing the photosensitive resin composition and a second film prepared by curing the photosensitive resin composition.

In various embodiments, the film prepared by curing the photosensitive resin composition may be positioned in at least one direction of travel of light emitted from the emission layer.

The substrate may include a plurality of sub-pixel regions, and the film prepared by curing the photosensitive resin composition may include a plurality of anti-reflective regions corresponding to the plurality of the sub-pixel regions, respectively.

In addition, a light-shielding region may be formed between each of the plurality of anti-reflective regions.

In various embodiments, the plurality of anti-reflective regions may include a first anti-reflective region that prevents or reduces reflection of a first color of light, a second anti-reflective region that prevents or reduces reflection of a second color of light, and a third anti-reflective region that prevents or reduces reflection of a third color of light, wherein the first to third colors of light may be different from each other.

For example, the first color of light may be red, the second color of light may be green, and the third color of light may be blue.

In various embodiments, the OLED device may have a structure in which the first electrode is an anode, the second electrode is a cathode, the organic layer further includes a hole transport region between the first electrode and the emission layer and an electron transport region between the emission layer and the second electrode, wherein the hole transport region may include a hole injection layer, a hole transport layer, an emission auxiliary layer, an electron blocking layer, or any suitable combination thereof, and the electron transport region may include a buffer layer, a hole blocking layer, an electron control layer, an electron transport layer, an electron injection layer, or any suitable combination thereof.

Hereinafter, one or more embodiments will be described in more detail with reference to the following examples. However, these examples are not intended to limit the scope of the present disclosure.

Unless defined otherwise, a percentage and a mixing ratio are based on weight in the following examples.

EXAMPLE

Examples 1 to 8, Comparative Examples 1 and 2

Photosensitive resin compositions were prepared by mixing each of the components having a composition and an amount shown in Table 1. A unit of the amounts in Table 1 is wt %, unless stated otherwise.

TABLE 1

| Component | Type | Example 1 | 2 | 3 | 4 | 5 | 6 | 7 | 8 | Comparative Example 1 | 2 |
|---|---|---|---|---|---|---|---|---|---|---|---|
| First binder resin | A-1 | 4 | 4 | 4 | 4 | 5 | 6 | 7 | 7 | — | — |
|  | A-2 | — | — | — | — | — | — | — | — | 4 | 4 |
| Second binder resin | AE-1 | 2 | — | 1 | 2 | 2 | — | — | — | — | — |
|  | AE-2 | — | 2 | 1 | 1 | — | — | — | — | — | 2 |
| Photo cross-linking agent | B | 6 | 6 | 6 | 6 | 6 | 6 | 6 | 3 | 3 | 3 |
|  | B-1 | — | — | — | — | — | — | — | 0.5 | — | — |
| Thermal curing agent | C | 0.5 | 0.5 | 0.5 | 0.6 | 0.5 | 0.5 | 0.5 | 0.5 | — | 0.5 |
| Photo-initiator | D | 0.8 | 0.8 | 0.8 | 0.8 | 0.8 | 0.8 | 0.8 | 0.8 | 0.8 | 0.8 |
| Pigment | E-1 (green) | 6 | — | — | 6 | — | 6 | — | — | 6 | — |
|  | E-2 (blue) | — | 5 | — | — | 5 | — | 5 | 5 | — | 5 |
|  | E-3 (red) | — | — | 6 | — | — | — | — | — | — | — |
| Dye | F | — | 0.5 | — | — | 0.5 | — | 0.5 | 0.5 | — | 0.5 |
| Additive | G | 0.2 | 0.2 | 0.2 | 0.2 | 0.2 | 0.2 | 0.2 | 0.2 | 0.2 | 0.2 |
| Solvent | H | 80.5 | 81 | 80.5 | 79.4 | 80 | 80.5 | 80 | 82.5 | 86.0 | 84.0 |

A-1: An acid-modified bisphenol epoxy acrylate resin (acidity-90 (mg KOH/g) based on a solid content, weight average molecular weight=15,000 Daltons) represented by Formula 1A:

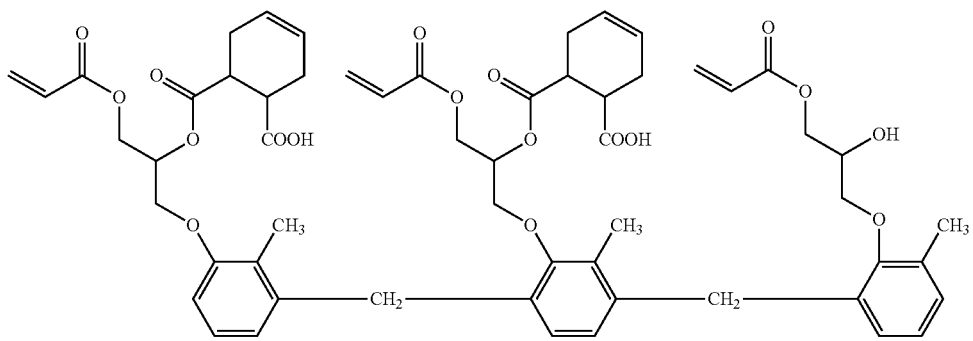

Formula 1A

A-2: An alkali-soluble copolymer having a copolymerization ratio of styrene/methacrylic acid/hydroxyethylmethacrylic acid of 60/20/20 (weight average molecular weight=30000 Daltons)

AE-1: A siloxane-containing epoxy resin represented by Formula 2A:

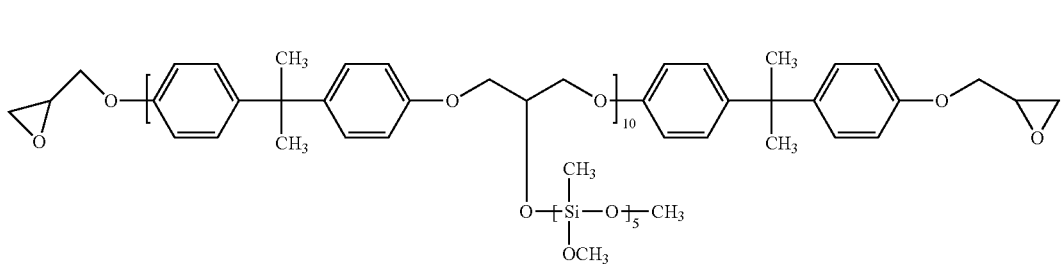

Formula 2A

AE-2: An epoxy resin represented by Formula 2B:

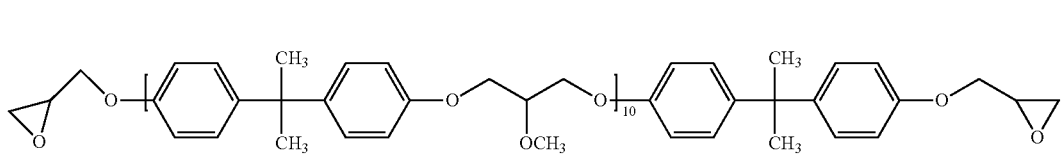

Formula 2B

B: Dipentaerythritolhexaacrylate (available from: Nippon Kayaku Co. Ltd., as DPHA)

B-1: Tris[2-(3-mercaptopropionyloxy)ethyl]isocyanurate (available from: SC Organic Chemicals Co. Ltd., as TEMPIC)

C: Isophorone Diamine (available from: BASF SE, as Baxxodur® EC 201)

D: An oxime-based initiator (available from: BASF SE, as OXE-01)

E-1: E-1: A green pigment (available from: Special Colorant Industry Co. Ltd., as C.I. G58)

E-2: A blue pigment (available from: Iridos Co. Ltd., as C.I. 15:6)

E-3: A red pigment (available from: SKC Hass Co. Ltd., as C.I. 254)

F: A violet dye (available from: Kyung-In Synthetic Co. Ltd., as V221)

G: A fluorine-based compound (available from: DIC Co. Ltd., as F445)

Propyleneglycolmonoethyletheracetate

Evaluation Example 1 (Evaluation of Single-Layered Film Sample)

The photosensitive resin compositions of Examples 1 to 8 and Comparative Examples 1 and 2 were each spin-coated on a respective glass substrate (10 cm×10 cm) having a thickness of 3 μm, and then, pre-baked on a hop plate at a temperature of 90° C. for 2 minutes, thereby obtaining a coating layer. A photomask was placed on the coating layer thus obtained, and the photomask was exposed to light at a light exposure of 40 mJ/cm² by using light having a wavelength of about 365 nm from an ultra-high pressure mercury lamp. Then, an image was developed by applying a KOH developing solution (DCD-260CF, available from Dongjin (Semichem Co. Ltd.)) through a spray nozzle for 60 seconds, and post-baked at 90° C. for 60 minutes to obtain each of Samples 1 to 10 as a single-layered film having a size of 10 cm×10 cm.

Transmittance Measurement

Transmittance (%) of each of Samples 1 to 10 was measured by using an MCPD-3000 photodetector spectrometer (available from Otsuka), and the results are shown in Table 2.

FIG. 1 is a graph showing spectroscopic characteristics of the film prepared from the photosensitive resin composition prepared according to Example 1.

Referring to FIG. 1, it may be confirmed that transmittance of the film prepare from the photosensitive resin composition prepared according to Example 1 was about 70% or higher around a wavelength in a range of 525 nm to 550 nm. Additionally, the transmittance of each film prepared from the photosensitive resin composition prepared according to Example 4 or 6 was about 70% or higher around a wavelength in a range of 525 nm to 550 nm.

Figure 2:
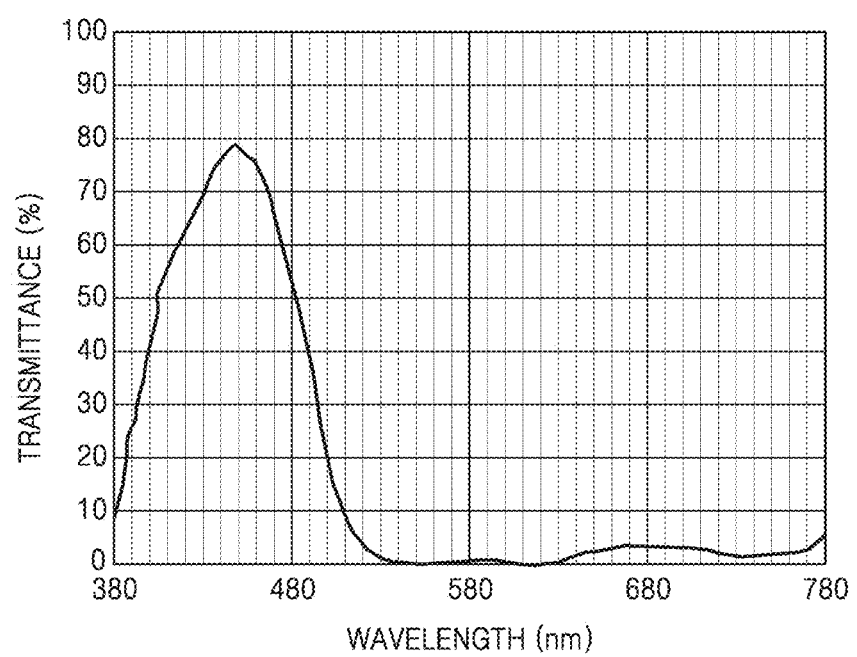
FIG. 2 is a graph showing spectroscopic characteristics of a photosensitive resin composition prepared according to Example 2.

FIG. 2 is a graph showing spectroscopic characteristics of the film prepared from the photosensitive resin composition prepared according to Example 2.

Referring to FIG. 2, it may be confirmed that transmittance of the film prepared from the photosensitive resin composition prepared according to Example 2 was about 65% or higher around a wavelength in a range of 450 nm to 475 nm. Additionally, the transmittance of each film prepared from the photosensitive resin composition prepared according to Example 5, 7, or 8 was about 65% or higher around a wavelength in a range of 450 nm to 475 nm.

Figure 3:
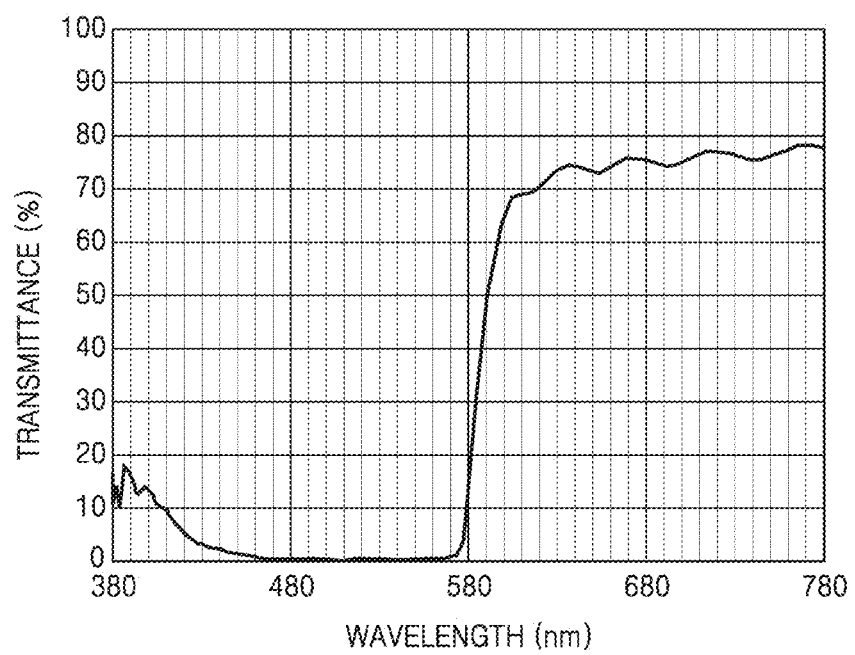
FIG. 3 is a graph showing spectroscopic characteristics of a photosensitive resin composition prepared according to Example 3.

FIG. 3 is a graph showing spectroscopic characteristics of the film prepared from the photosensitive resin composition prepared according to Example 3.

Referring to FIG. 3, it may be confirmed that transmittance of the film prepared from the photosensitive resin composition prepared according to Example 3 was about 70% or higher around a wavelength in a range of 620 nm or higher.

Measurement of Chemical Resistance

Each of Samples 1 to 10 was immersed in 16 ml of a respective propylene glycol methylether acetate (PGMEA) solution at room temperature for 30 minutes, and color differences (ΔEab) of Samples 1 to 10 were measured by using a colorimeter (a photodetector spectrometer, model name: MCPD-3000, available from Otsuka). The results are shown in Table 2.

The color difference (ΔE*ab) is a value calculated according to the equation below based on measurements of color purity (L*, a*, b*) of the films before and after immersion. Here, a large value denotes a significant change in color:

$$\Delta E^*_{ab} = \sqrt{(\Delta L^*)^2 + (\Delta a^*)^2 + (\Delta b^*)^2}$$

Reflectivity Measurement

Reflectivities of Samples 1 to 10 were measured by using a CM-5 available from KONICA MINOLTA, and the results are shown in Table 2.

TABLE 2

| | | Transmittance (%) | Chemical resistance (ΔEab) | Reflectivity (%) |
|---|---|---|---|---|
| Example 1 | Sample 1 | 73 | 0.76 | 5.00 |
| Example 2 | Sample 2 | 67 | 5.84 | 4.24 |
| Example 3 | Sample 3 | 76 | 2.38 | 4.66 |
| Example 4 | Sample 4 | 72 | 1.03 | 4.23 |
| Example 5 | Sample 5 | 69 | 1.43 | 4.67 |
| Example 6 | Sample 6 | 73 | 1.15 | 4.47 |
| Example 7 | Sample 7 | 67 | 1.87 | 4.8 |
| Example 8 | Sample 8 | 68 | 1.03 | 4.05 |
| Comparative Example 1 | Sample 9 | 43 | 33.06 | 5.21 |
| Comparative Example 2 | Sample 10 | 55 | 29.05 | 5.92 |

Referring to Table 2, it was confirmed that each of the films of Samples 1 to 8, which were respectively prepared by using the photosensitive resin compositions of Examples 1 to 8, had excellent transmittance and improved chemical resistance, and low reflectivity, as compared with those of the films of Samples 9 and 10 respectively prepared by using the photosensitive resin compositions of Comparative Examples 1 and 2.

Evaluation Example 2 (Evaluation of Film Sample Having Stacked Structure)

Samples 11 to 20, each as a film having a respective 2-layered structure as shown in Table 3, were prepared in substantially the same manner as described with respect to Evaluation Example 1. Color differences (ΔEab) of Samples 1 to 10, each of which is respectively a first layer of the 2-layered structures of Samples 11 to 20, were measured in the following manner, and pattern images of Samples 11 to 20 were evaluated as follows.

Color Difference

Color differences (ΔE*ab) of the first film of the stacked structures of each sample were measured by using a colorimeter (manufacturer: model name: MCPD-3000, available from Otsuka), and the results are shown in Table 3. The color difference (ΔE*ab) is a value calculated according to the equation below based on measurements of color purity (L*, a*, b*) of the first film before and after stacking. Here, a large value denotes a significant change in color:

$$\Delta E^*ab = \sqrt{(\Delta L^*)^2 + (\Delta a^*)^2 + (\Delta b^*)^2}$$

TABLE 3

Figure 4:
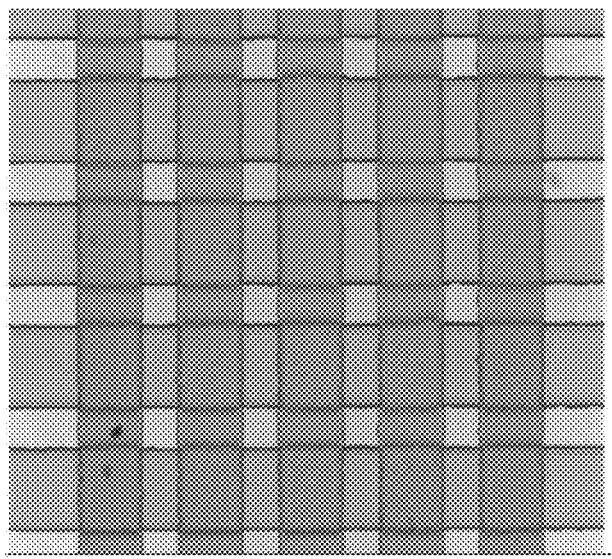
FIGS. 4 to 13 are images of patterns of Samples 11 to 20, respectively.
Figure 5:
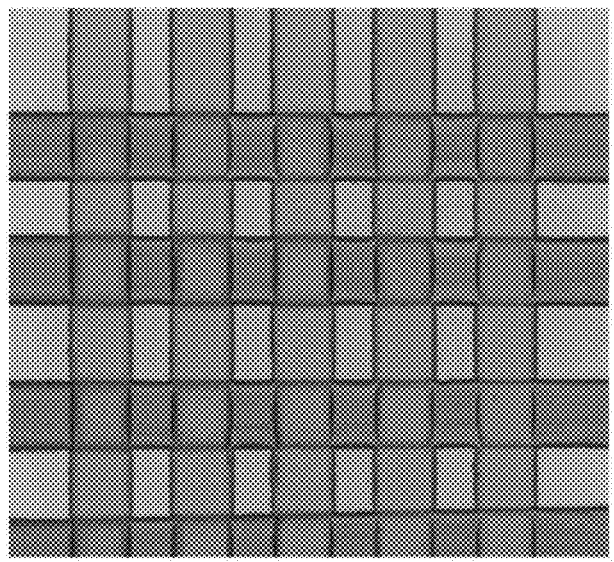
Figure 6:
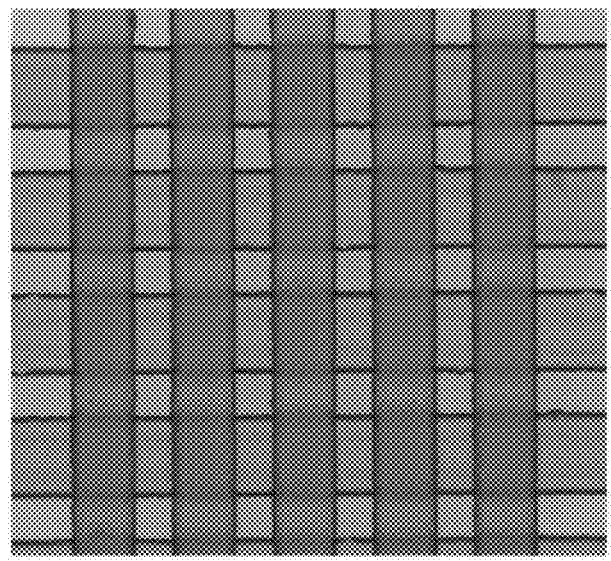
Figure 7:
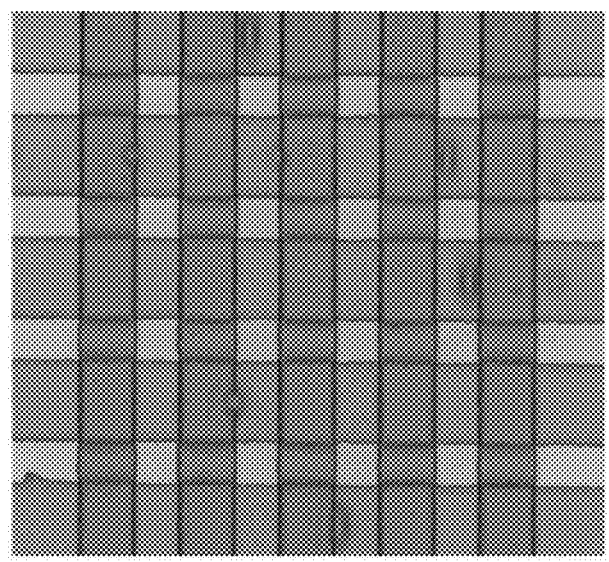
Figure 8:
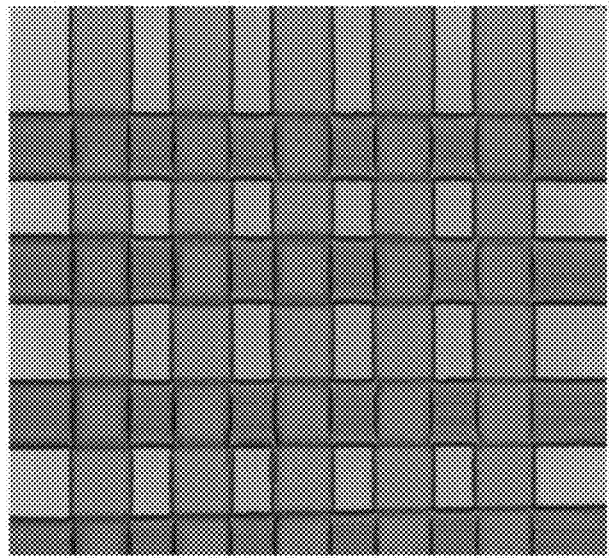
Figure 9:
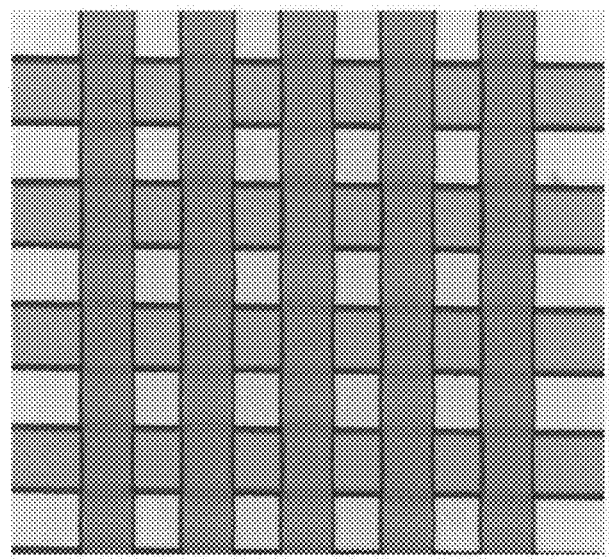
Figure 10:
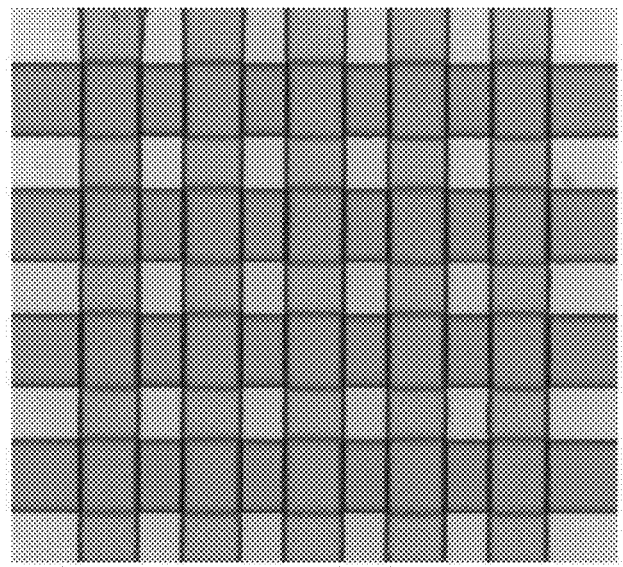
Figure 11:
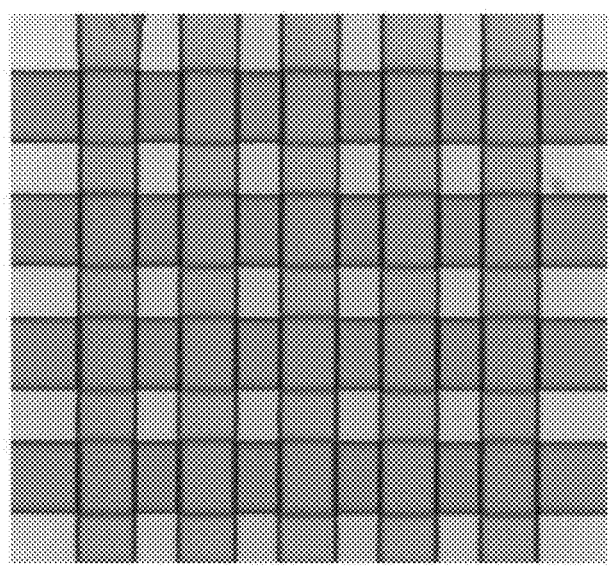
Figure 12:
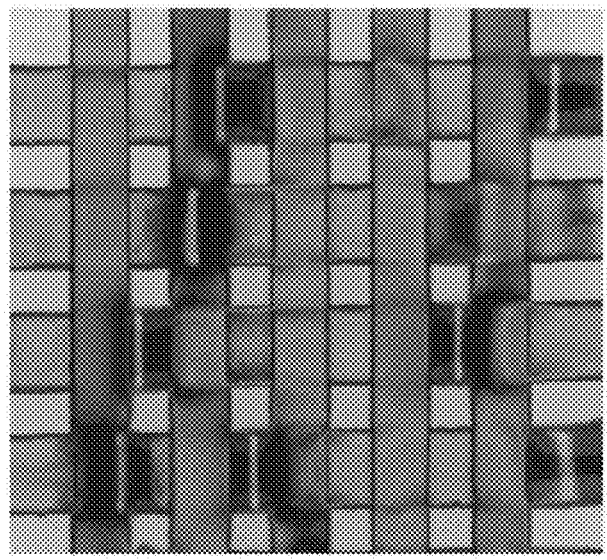
Figure 13:
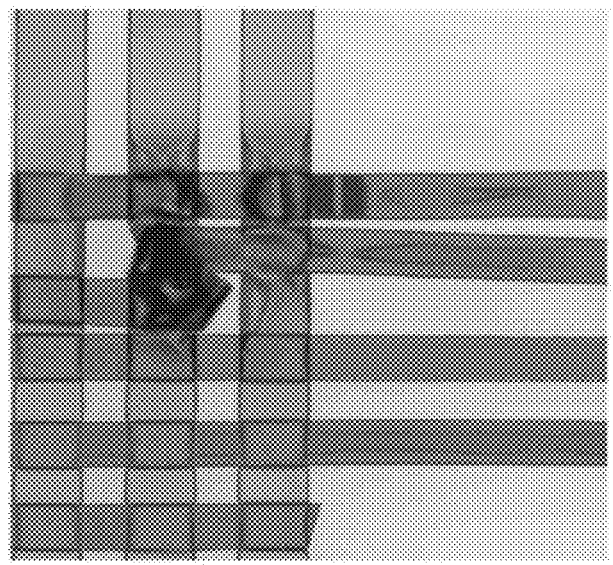

| | Stacked structure (first layer/second layer) | Color difference with respect to first layer (ΔE*ab) | Pattern straightness after stacking |
|---|---|---|---|
| Sample 11 | Sample 1 (green)/Sample 2 (blue) | 1.08 | FIG. 4 |
| Sample 12 | Sample 2 (blue)/Sample 3 (red) | 3.56 | FIG. 5 |
| Sample 13 | Sample 3 (red)/Sample 1 (green) | 2.02 | FIG. 6 |
| Sample 14 | Sample 4 (green)/Sample 2 (blue) | 1.21 | FIG. 7 |
| Sample 15 | Sample 5 (blue)/Sample 3 (red) | 1.30 | FIG. 8 |
| Sample 16 | Sample 6 (green)/Sample 2 (blue) | 1.31 | FIG. 9 |
| Sample 17 | Sample 7 (blue)/Sample 3 (red) | 2.85 | FIG. 10 |
| Sample 18 | Sample 8 (blue)/Sample 3 (red) | 1.50 | FIG. 11 |
| Sample 19 | Sample 9 (green)/Sample 2 (blue) | 39.02 | FIG. 12 |
| Sample 20 | Sample 10 (blue)/Sample 3 (red) | 34.13 | FIG. 13 |

Referring to Table 3, it was confirmed that the films of Samples 1 to 8, which were respectively prepared by using the photosensitive resin compositions of Examples 1 to 8, had less color differences as compared with those of the films of Samples 9 and 10 respectively prepared by using the photosensitive resin compositions of Comparative Examples 1 and 2.

Pattern Straightness

Pattern images of Samples 11 to 20 of Table 4 were observed, and the results are shown in FIGS. 4 to 13.

Referring to FIGS. 4 to 13, it may be confirmed that Samples 11 to 18 (see FIGS. 4 to 11) had excellent pattern straightness, as compared with those of Samples 19 and 20 (see FIGS. 12 and 13).

The pattern straightness may refer to a curing degree at a low temperature (e.g., about 0° C. to about 100° C., about 40° C. to about 100° C., or about 70° C. to about 100° C.) upon stacking of each sample.

Evaluation Example 3 (Preparation and Evaluation of OLED Device)

Preparation of OLED Device 1

An anode including a metallic material, an organic layer including a light-emitting material and an emission layer, a cathode including a conducting material, and Sample 1 were sequentially stacked in this stated order, thereby completing the preparation of OLED device 1.

Preparation of OLED Devices 2 to 10

OLED devices 2 to 10 were prepared in substantially the same manner as described with respect to OLED device 1, except that samples shown in Table 4 were used as the film instead of Sample 1.

Reflectivity Evaluation

Reflectivity of each of OLED devices 1 to 10 was measured by using a CM-3700A available from KONICA MINOLTA, and the results are shown in Table 4.

TABLE 4

|  | Film | Reflectivity (%) |
|---|---|---|
| OLED device 1 | Sample 1 | 5.75 |
| OLED device 2 | Sample 2 | 5.75 |
| OLED device 3 | Sample 3 | 5.70 |
| OLED device 4 | Sample 4 | 5.72 |
| OLED device 5 | Sample 5 | 5.05 |
| OLED device 6 | Sample 6 | 5.99 |
| OLED device 7 | Sample 7 | 5.63 |
| OLED device 8 | Sample 8 | 5.61 |
| OLED device 9 | Sample 9 | 6.03 |
| OLED device 10 | Sample 10 | 6.12 |

Referring to Table 4, it may be confirmed that each of the OLED devices 1 to 8 respectively including the films prepared by using the photosensitive resin compositions of Examples 1 to 8 have low reflectivity, as compared with those of OLED devices 9 and 10 respectively including the films prepared by using the photosensitive resin compositions of Comparative Examples 1 and 2.

As described above, according to one or more embodiments, the photosensitive resin composition may be cured at a low temperature (e.g., about 0° C. to about 100° C., about 40° C. to about 100° C., or about 70° C. to about 100° C.), for example, a temperature of about 100° C. or lower. The film prepared by curing the photosensitive resin composition may then have excellent transmittance, improved chemical resistance, excellent pattern straightness, and improved anti-reflection characteristics.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A photosensitive resin composition comprising:
a first binder resin represented by Formula 1:

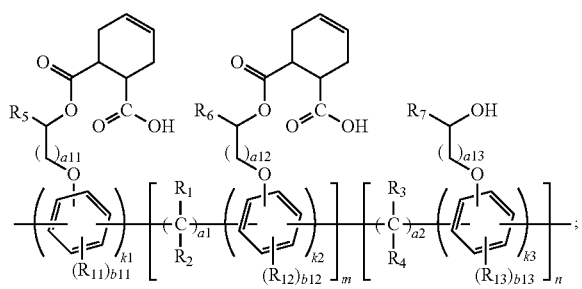

Formula 1 and
a second binder resin comprising an epoxy resin,
wherein, in Formula 1,
$R_1$ to $R_4$ and $R_{11}$ to $R_{13}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_5$ to $R_7$ are each independently a group including an unsaturated ethylene group, the group including the unsaturated ethylene group does not include a phthalate group, a1 and a11 to a13 are each independently an integer of 1 to 5, a2 is an integer of 0 to 5, b11 to b13 are each independently an integer of 0 to 3, k1, k2, k3, m, and n are each independently a molar ratio in a corresponding repeating unit, the sum of k1 and k2 is an integer of 1 to 20, k3 is an integer of 1 to 10, m and n are each independently an integer of 1 to 10, and at least one substituent of the substituted $C_1$-$C_{20}$ alkyl group, the substituted $C_2$-$C_{20}$ alkenyl group, the substituted $C_2$-$C_{20}$ alkynyl group, the substituted $C_1$-$C_{20}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{30}$ aryl group, the substituted $C_6$-$C_{30}$ aryloxy group, the substituted $C_6$-$C_{30}$ arylthio group, and the substituted $C_1$-$C_{30}$ heteroaryl group is selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group.

2. The photosensitive resin composition of claim 1, wherein, in Formula 1, $R_1$ to $R_4$ and $R_{11}$ to $R_{13}$ are each independently hydrogen, deuterium, or a substituted or unsubstituted $C_1$-$C_{20}$ alkyl group.

3. The photosensitive resin composition of claim 1, wherein, in Formula 1, $R_5$ to $R_7$ are each independently a group represented by
\*—$R_a$OC(=O)CH=CH$_2$, $R_a$ is a substituted or unsubstituted $C_1$-$C_{20}$ alkylene group, at least one substituent of the substituted $C_1$-$C_{20}$ alkylene group is selected from deuterium, —F, —Cl, —Br, —I, a hydroxyl group, a cyano group, an epoxy group, a nitro group, an amidino group, a hydrazino group, a hydrazono group, a $C_1$-$C_6$ alkyl group, a $C_2$-$C_6$ alkenyl group, a $C_2$-$C_6$ alkynyl group, a $C_1$-$C_6$ alkoxy group, and a $C_6$-$C_{20}$ aryl group, and \* indicates a binding site to a neighboring atom.

4. The photosensitive resin composition of claim 1, wherein, in Formula 1, a molar ratio of m:n is in a range of about 10:90 to about 50:50.

5. The photosensitive resin composition of claim 1, wherein an acid value of the first binder resin is in a range of about 50 mgKOH/g to about 120 mgKOH/g.

6. The photosensitive resin composition of claim 1, wherein an amount of the first binder resin is in a range of about 3 wt % to about 30 wt % based on the total weight of the photosensitive resin composition.

7. The photosensitive resin composition of claim 1, wherein the second binder resin is represented by Formula 2:

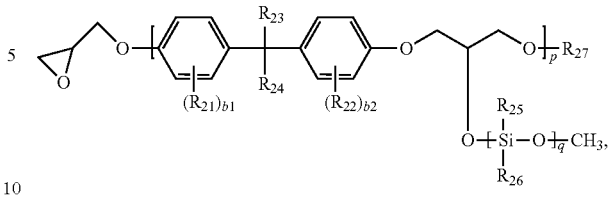

Formula 2 wherein, in Formula 2, $R_{21}$ to $R_{24}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{25}$ and $R_{26}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, $R_{27}$ is selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, a substituted or unsubstituted heteroaryl group, and a group represented by Formula 3, b1 and b2 are each independently an integer of 0 to 4, p and q are each independently a molar ratio of a corresponding repeating unit, p is an integer of 5 to 300, q is an integer of 0 to 20, and

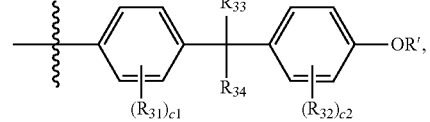

Formula 3 in Formula 3, $R_{31}$ and $R_{32}$ are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, and a substituted or unsubstituted $C_1$-$C_{20}$ alkoxy group, $R_{33}$, $R_{34}$, and R' are each independently selected from hydrogen, deuterium, a substituted or unsubstituted $C_1$-$C_{20}$ alkyl group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ alkoxy group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_1$-$C_{30}$ heteroaryl group, and c1 and c2 are each independently an integer of 0 to 4.

8. The photosensitive resin composition of claim 7, wherein, in Formula 2,
   $R_{23}$ to $R_{26}$ are each independently a substituted or unsubstituted $C_1$-$C_{20}$ alkyl group, and $R_{27}$ is a group represented by Formula 3, and
in Formula 3,
   R' is a $C_1$-$C_{20}$ alkyl group substituted with an epoxy group or a $C_6$-$C_{30}$ aryl group substituted with an epoxy group,
   p is an integer of 10 to 300, and
   q is an integer of 3 to 20.

9. The photosensitive resin composition of claim 7, wherein the second binder resin is represented by Formula 2-1:

Formula 2-1

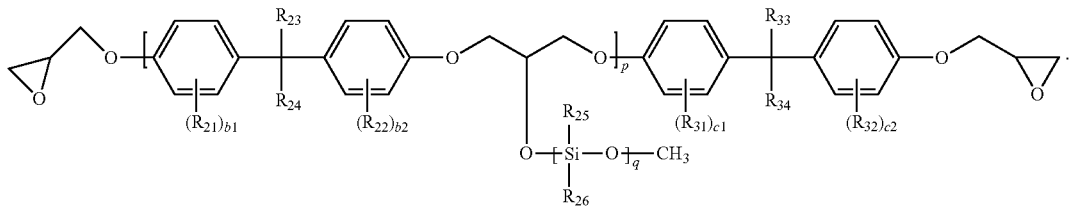

10. The photosensitive resin composition of claim 1, wherein an amount of the second binder resin is in a range of about 1 wt % to about 10 wt % based on the total weight of the photosensitive resin composition.

11. The photosensitive resin composition of claim 1, wherein the photosensitive resin composition further comprises at least one selected from a photo cross-linking agent, a thermal curing agent, a photoinitiator, a pigment, and a solvent.

12. The photosensitive resin composition of claim 11, wherein the photo cross-linking agent comprises at least one monomer selected from a urethane monomer and a cross-linking monomer having a group comprising an unsaturated ethylene group.

13. The photosensitive resin composition of claim 11, wherein a weight ratio of the photo cross-linking agent to the first binder resin is in a range of about 1:0.6 to about 1:2.5.

14. The photosensitive resin composition of claim 11, wherein an amount of the photo cross-linking agent is in a range of about 3 wt % to about 15 wt % based on the total weight of the photosensitive resin composition.

15. The photosensitive resin composition of claim 12, wherein the photo cross-linking agent further comprises a monomer comprising a thiol group.

16. The photosensitive resin composition of claim 11, wherein the thermal curing agent comprises at least one selected from a compound comprising an aromatic amine group, a compound comprising an alicyclic amine group, an aromatic amine-based a compound comprising an aromatic amine group, based a compound comprising a carboxylic acid group, a compound comprising an acid anhydride group, a compound comprising a polyphenol group, and a compound comprising an imidazole group.

17. The photosensitive resin composition of claim 11, wherein the photoinitiator comprises at least one selected from a compound comprising an oxime group, a compound comprising a triazine group, a compound comprising a benzoin group, a compound comprising an acetophenone group, a compound comprising a xanthone group, and a compound comprising an imidazole group.

18. A film formed by curing the photosensitive resin composition of claim 1.

19. An organic light-emitting display device comprising the film of claim 18.

* * * * *